United States Patent [19]

Oates

[11] Patent Number: 5,046,415
[45] Date of Patent: Sep. 10, 1991

[54] COMPOSITE STENCIL FOR SCREEN PRINTING

[75] Inventor: William L. Oates, Pompano Beach, Fla.

[73] Assignee: Motorola, Inc., Schaumburg, Ill.

[21] Appl. No.: 651,103

[22] Filed: Feb. 4, 1991

Related U.S. Application Data

[63] Continuation of Ser. No. 293,918, Jan. 6, 1989, abandoned.

[51] Int. Cl.⁵ .............................................. B05C 17/06
[52] U.S. Cl. ............................... 101/128.21; 101/129
[58] Field of Search ................. 101/127, 128.1, 128.21, 101/128.4, 129; 204/11, 157.15, 157.63

[56] References Cited

U.S. PATENT DOCUMENTS

| | | | |
|---|---|---|---|
| 2,829,460 | 4/1958 | Golay | 101/128.1 X |
| 4,091,727 | 5/1978 | Hasegawa et al. | 101/128.21 |
| 4,096,308 | 6/1978 | Reed | 101/128.21 X |
| 4,142,464 | 3/1979 | Rauch | 101/128.1 |
| 4,401,520 | 8/1983 | Steppan et al. | 204/11 |
| 4,529,477 | 7/1985 | Lundberg et al. | 156/659.1 |

OTHER PUBLICATIONS

Circuits Manufacturing, Sep. 1985, vol. 25, No. 9, "Better Solder Printing with Stencils?".

Primary Examiner—Edgar S. Burr
Assistant Examiner—Moshe I. Cohen
Attorney, Agent, or Firm—Daniel K. Nichols

[57] ABSTRACT

A composite stencil for screen printing solder paste includes a layer of metalic material such as brass and a layer of flexible material bonded to the metalic layer. The metalic layer has a thickness of 0.002 to 0.010 inches, while the flexible layer is 0.002 to 0.010 inches thick. The combined thickness of the composite stencil is approximately 0.008 to 0.012 inches. The stencil can be manufactured by forming openings in the metalic sheet and then applying a layer of photosensitive flexible material to the metalic sheet. The metalic sheet is then used as a stencil to expose the photosensitive material.

7 Claims, 1 Drawing Sheet

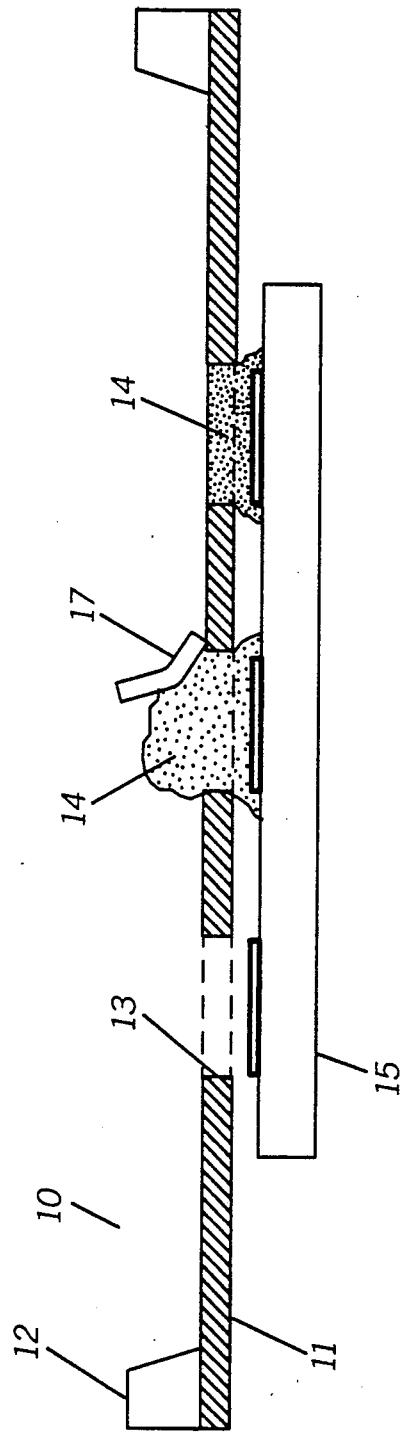
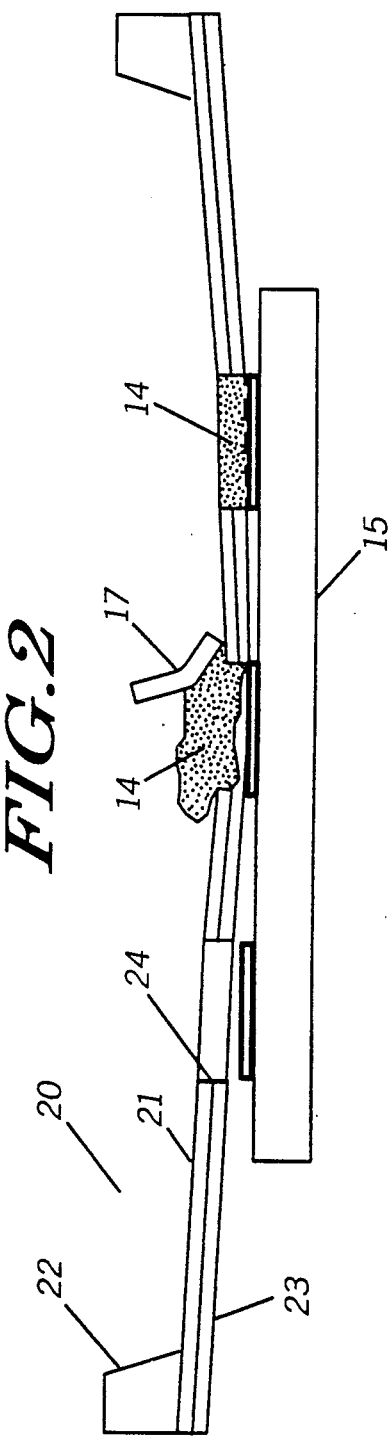

COMPOSITE STENCIL FOR SCREEN PRINTING

This is a continuation of application Ser. No. 293,918, filed Jan. 6, 1989, and now abandoned.

BACKGROUND OF THE INVENTION

The present invention relates to printing of thick emulsions through a stencil in general, and particularly to stencil printing of solder paste for electronics. Conventional screen printing as used for manufacturing electronic hybrid devices and surface mount technology favors flexible screens constructed from stainless steel screen, woven in an open mesh and stretched taut across a rigid rectangular frame. Openings are selectively provided in the screen in a pattern that represents the pattern of the desired print, and the ink, emulsion or solder paste is forced through the openings by the hydraulic action of the squeegee moving across the stencil surface. The deposited thickness of the ink or paste is controlled by the thickness of the screen.

Another form for printing, illustrated in FIG. 1, involves the use of a metal stencil 10 fabricated from a thin sheet of metal 11 stretched taut across a rigid frame 12. The openings 13 in the stencil 10 are machined or etched in the desired pattern, and the ink or paste 14 is printed through the openings as in above. Again, the thickness of the deposited material 14 is controlled by the thickness of the metal stencil 10.

Use of conventional mesh screens for solder paste printing for surface mount technology is not practical because of the relatively large volume of material required to be deposited on each printed area. Large openings in the screen cause uneven tension distributions in the taut screen, creating poor quality printing. In addition, the very close spacing required by surface mount technologies also affects the tension in the mesh screen. For these reasons, a metal stencil of 0.008 to 0.010 inches thick is typically used in place of the mesh screen.

In order to obtain a print height of 0.008 inches, the solder paste must be screened at a high viscosity to prevent "slumping" after printing, but as the template has little or no flexibility, it is not possible to bring it into intimate contact with the surface of substrate 15, due to variations in the surface contours of the substrate. Around the critical edges of the closely spaced openings in the stencil, it is not unusual to find a gap of 0.002 inches or more. The downward pressure created by the action of the squeegee 17 on the stencil is not enough to locally deform the stencil into intimate contact with the substrate. Hydraulic pressure on the solder paste 14 causes some of the paste to be extruded sideways in to the gap between the stencil and the substrate. This occurs at each squeegee stroke, and progressively builds up a deposit on the lower surface of the template, around each opening, so that the printed areas extend into the separating spaces between solder pads. The printed pattern is then no longer acceptable and the machine must be halted while the template is cleaned. Because the gap between stencil and substrate varies due to individual variations in the substrates, the frequency of cleaning also varies widely, and is a major obstacle to high speed automated printing.

SUMMARY OF THE INVENTION

This composite stencil is flexible for conforming to the substrate as solder paste is applied. The composite stencil includes layers of metalic material and flexible or plastic material bonded together. The stencil has a combined thickness of approximately 0.010 to 0.012 inches. The individual layers are 0.002 to 0.010 inches thick.

In one aspect of the invention the composite stencil can be manufactured by first forming the desired openings in the metalic sheet. A layer of flexible photosensitive material is then applied to the metalic sheet. The photosensitive material is then exposed through the openings in the metalic sheet and the photosensitive sheet is developed to provide openings therethrough.

BRIEF DESCRIPTION OF THE DRAWINGS

FIG. 1 is a cross-sectional view of a prior art screen printing stencil.

FIG. 2 is a cross-sectional view of a composite stencil for screen printing in accordance with the present invention.

DESCRIPTION OF THE PREFERRED EMBODIMENT

Referring now to FIG. 2, it will be understood that the stencil assembly 20 includes a thin metal template 21 that is bonded to a rigid frame 22 as by using fasteners or adhesives. The template 21 is stretched taut across the frame 22 in order to provide a planer metal sheet. The thickness of the template 21 can be varied to suit the individual application, but preferably is 0.002 to 0.006 inches. A layer of resilient material 23 such as plastic or rubber is then bonded to the underside of the metal template 21. The thickness of the resilient material 23 can also be varied to suit the individual application, but for printing onto printed circuit boards a thickness of 0.002 to 0.008 inches is considered most desirable. For printing solder paste a total thickness of 0.008 to 0.012 inches is considered most desirable. The resilient material can be composed of a number of polymers such as silicone or natural rubber, acrylics, urethanes, and polyesters, with the preferred material being a photo-definable material such as a photoimageable silicone, urethane or acrylic. The stencil openings 24 that comprise the pattern to be printed are formed through the metal template 21 and the resilient material 23.

The method of forming the openings 24 may depend on the materials used for the resilient layer 23. In the preferred embodiment, the openings in the metal template 21 are formed by a conventional etching process. A photosensitive layer of resilient material 23 is then bonded to the metal layer 21, the photosensitive material is exposed by shining light through the openings 24, and is then developed to provide the openings. If desired, the openings 24 may be made through the metal template 21 and the resilient layer 23 simultaneously as by mechanical means such as milling or punching.

The total thickness of the metal/resilient material composite is equal to that which would be utilized if the system were a single metal plate. The ratio of the metal thickness to the resilient material thickness is not critical, but it should be recognized that given a constant total thickness, the thinner metal template will permit a thicker layer of resilient material.

As the composite stencil 20 of the invention is placed in proximity with the substrate to be printed, the downward pressure of the squeegee 17 causes the resilient material 23 to be deformed about the irregularities of the substrate 15, creating a seal around the areas to be printed. The hydraulic pressure of the solder paste 14 is now contained to the area of the opening 24 and is not sufficient to extrude the paste into undesired areas. The underside of the composite stencil 20 remains clean and free from residue around the openings that is normally found on conventional systems. The "slump" of the solder paste 14 using the invention is considerably less than with conventional systems, and the total weight of the print can be approximately 10% less than a print made with a conventional stencil.

I claim as my invention:

1. A composite stencil having a plurality of openings for use in the screen printing of solder paste onto a substrate surface comprising:
   a layer of metallic material,
   means for providing a seal about said openings during screen printing, said means including a layer of resilient material bonded to the metallic layer, said plurality of openings extending through both of said layers the resilient material being engageable with the substrate surface for providing said seal means about the openings during screen printing operation.

2. A composite stencil as defined in claim 1, in which: the metalic layer has a thickness of 0.002 to 0.010 inches.

3. A composite stencil as defined in claim 1, in which: the resilient layer has a thickness of 0.002 to 0.010 inches.

4. A composite stencil as defined in claim 1, in which: the layers of metallic and resilient material have a combined thickness of approximately 0.008 to 0.012 inches.

5. A composite stencil as defined in claim 1, in which the resilient material is plastic.

6. A composite stencil as defined in claim 1, in which the resilient photosensitive material is rubber.

7. A method of manufacturing a composite stencil for use in the screen printing solder paste onto a substrate surface comprising the steps of:
   providing a metallic sheet,
   forming openings through the metallic sheet in a desired printing pattern,
   providing a seal about the openings during screen printing operation by applying a layer of resilient photosensitive material to the metallic sheet,
   exposing the photosensitive material through the openings in the metallic sheet, and
   developing the photosensitive material to provide openings therethrough wherein the photosensitive material provides said seal about the openings which extend through both said metallic sheet and said layer of photosensitive material during screen printing operation.

* * * * *